(12) United States Patent
Nuttinck et al.

(10) Patent No.: US 7,867,864 B2
(45) Date of Patent: Jan. 11, 2011

(54) METHOD OF MANUFACTURING A SEMICONDUCTOR DEVICE AND SEMICONDUCTOR DEVICE OBTAINED WITH SUCH A METHOD

(75) Inventors: Sebastien Nuttinck, Heverlee (BE); Giberto Curatola, Korbek-lo (BE); Erwin Hijzen, Blanden (BE); Philippe Meunier-Beillard, Kortenberg (BE)

(73) Assignee: NXP B.V., Eindhoven (NL)

( * ) Notice: Subject to any disclaimer, the term of this patent is extended or adjusted under 35 U.S.C. 154(b) by 56 days.

(21) Appl. No.: 12/160,210

(22) PCT Filed: Jan. 4, 2007

(86) PCT No.: PCT/IB2007/050022

§ 371 (c)(1),
(2), (4) Date: Jul. 7, 2008

(87) PCT Pub. No.: WO2007/077540

PCT Pub. Date: Jul. 12, 2007

(65) Prior Publication Data

US 2009/0159938 A1    Jun. 25, 2009

(30) Foreign Application Priority Data

Jan. 5, 2006    (EP) .................................. 06100109

(51) Int. Cl.
    *H01L 21/336*    (2006.01)
(52) U.S. Cl. .................. 438/300; 438/197; 438/222; 257/E21.131; 257/E21.377
(58) Field of Classification Search .......... 257/E21.051, 257/E21.131, E21.132, E21.297, E21.37, 257/E21.377, E21.395, E21.4, E21.431, E21.457, 257/E21.615
See application file for complete search history.

(56) References Cited

U.S. PATENT DOCUMENTS

| 5,481,126 | A | 1/1996 | Subramanian et al. |
| 6,599,789 | B1 * | 7/2003 | Abbott et al. ............... 438/161 |
| 2003/0153155 | A1 | 8/2003 | Wang et al. |
| 2004/0021179 | A1 | 2/2004 | Lee et al. |
| 2004/0212024 | A1 | 10/2004 | Oh et al. |
| 2005/0173735 | A1 | 8/2005 | Li |
| 2006/0231873 | A1 * | 10/2006 | Anderson et al. ........... 257/288 |

OTHER PUBLICATIONS

Tabrizi M M et al; "Extracting of Substrate Network Resistances in RFCMOS Transistors"; Topical Meeting on Silicon Monolithic Integrated Circuits in RF Systems, 2004, Digest of Papers; 2004 Atlanta, GA, USA; Sep. 8-10, 2004, p. 219-222.

* cited by examiner

*Primary Examiner*—Walter L Lindsay, Jr.
*Assistant Examiner*—Cheung Lee (57) ABSTRACT

The invention relates to a method of manufacturing a semiconductor device comprising a field effect transistor, in which method a semiconductor body of silicon with a substrate is provided at a surface thereof with a source region and a drain region of a first conductivity type which are situated above a buried isolation region and with a channel region, between the source and drain regions, of a second conductivity type, opposite to the first conductivity type, and with a gate region separated from the surface of the semiconductor body by a gate dielectric and situated above the channel region, wherein a mesa is formed in the semiconductor body in which the channel region is formed and wherein the source and drain regions are formed on both sides of the mesa in a semiconductor region that is formed using epitaxial growth, the source and drain regions thereby contacting the channel region.

11 Claims, 9 Drawing Sheets

METHOD OF MANUFACTURING A SEMICONDUCTOR DEVICE AND SEMICONDUCTOR DEVICE OBTAINED WITH SUCH A METHOD

The invention relates to a method of manufacturing a semiconductor device comprising a field effect transistor, in which method a semiconductor body of silicon with a substrate is provided at a surface thereof with a source region and a drain region of a first conductivity type which are situated above a buried isolation region and with a channel region, between the source and drain regions, of a second conductivity type, opposite to the first conductivity type, and with a gate region separated from the surface of the semiconductor body by a gate dielectric and situated above the channel region, and wherein a mesa is formed in the semiconductor body in which the channel region is formed and wherein the source and drain regions are formed on both side faces of the mesa in a semiconductor region that is formed using epitaxial growth, the source and drain regions thereby contacting the channel region.

A method as mentioned in the opening paragraph is known from US patent application US 2005/0173735 A1. Therein a method is described in which a depletion barrier layer is formed that covers a surface of an integrated circuit substrate adjacent opposite sides of a gate pattern and extending along a portion of a lateral face of the channel region of a MOSFET. A source/drain layer is disposed on the depletion barrier layer and electrically contacting the lateral face of the channel region in a region not covered by the depletion barrier layer. The channel region protrudes from a surface of the substrate. The depletion barrier layer is L-shaped and a further device isolation layer may be present disposed at predetermined portion of the substrate through the source/drain layer and the depletion barrier layer. The depletion barrier layer can comprise SiGe which is removed and the cavity is subsequently filled with an insulating material like a thermal oxide.

A drawback of such a method is that on the one hand the FET obtained is less suitable for high frequency application, in particular for RF (=Radio Frequency) applications and on the other hand the method itself is insufficiently versatile.

It is therefore an object of the present invention to avoid the above drawbacks and to provide a method that results in FETs that are suitable for RF applications and which is versatile.

To achieve this, a method of the type described in the opening paragraph is characterized in that the semiconductor region is formed contacting the mesa over substantially the whole thickness of the semiconductor region and is formed below the level of the gate dielectric. Through forming the semiconductor region below the level of the gate dielectric, a capacitive coupling between the source/drain regions and the gate region is substantially reduced. In this way the high-frequency behavior of the FET obtained is considerably improved. By keeping the semiconductor region in contact with the side faces of the mesa over its whole thickness, the crystallinity of the semiconductor region is improved since the epitaxial growth now also will take place during the whole growth process starting from the crystalline side faces of the mesa. The better crystallinity, in particular in the transition region between the channel region of the transistor and the source/drain regions, improves the device behavior and also makes the method according to the invention much more versatile. The latter is caused by the fact that epitaxial growth starting from the side faces of the mesa allows for formation of the isolation region already before formation of the semiconductor region on top of the isolation region.

In a preferred embodiment the source and drain regions are provided with extensions and are formed in the semiconductor region using two ion implantations alongside the mesa while during one of these ion implantations spacers are present on the side faces of the mesa. This provides an efficient way of obtaining transistors with the desired properties.

Preferably the source and drain regions with the extensions are provided with an interdigited comb like structure. The transistors obtained in this way have very good high-frequency properties.

In a preferred modification of this embodiment the transistor is surrounded by a sunken isolation region extending into the semiconductor body to a greater depth than the buried isolation region. In this way isolation between neighboring transistors is combined with an optimal design within the sunken isolation region. The present invention realizes that in case of a semiconductor region comprising SiGe the latter can be etched from mutually perpendicular directions. Thus, SiGe regions below the fingers of source and drain regions to be formed can be etched starting from a sunken region in which the sunken isolation is to be formed. In this way, such sunken isolation regions need not to be present between the fingers of the source/drain regions, which implies that the transistor can occupy a minimal area and can have excellent high-frequency properties.

In a further embodiment related thereto the buried isolation region is formed by formation of a further semiconductor region comprising a mixed crystal of silicon and germanium, which after formation of the semiconductor region is removed by selective etching.

Other important embodiments underlining the versatility of the method according to the invention are characterized in that the buried isolation region is formed before the forming of the semiconductor region by an over-all deposition of an insulating layer followed by removal of a part of the insulating layer.

In another embodiment it is preferred that at least parts of the side faces of the mesa are protected during processing by temporarily spacers. The protection is either against in particular etching for the removal of a part of a uniformly deposited insulating layer or against a local oxidation. Materials like silicon nitride are suitable material for the formation of such temporarily spacers.

Finally it is to be noted that the invention also comprises a semiconductor device comprising a field effect transistor obtained by a method according to the invention.

These and other aspects of the invention will be apparent from and elucidated with reference to the embodiments described hereinafter, to be read in conjunction with the drawing, in which.

Figure 1:
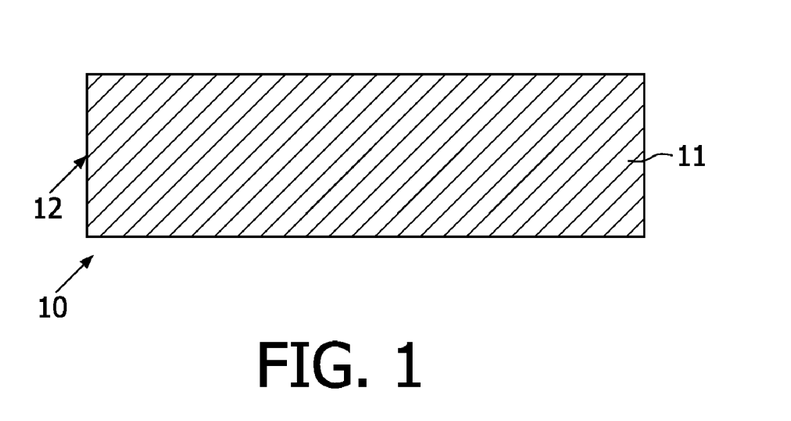
FIGS. 1 through 13 are sectional views of a semiconductor device with a field effect transistor at various stages in the manufacture of the device by means of a first embodiment of a method in accordance with the invention.
Figure 2:
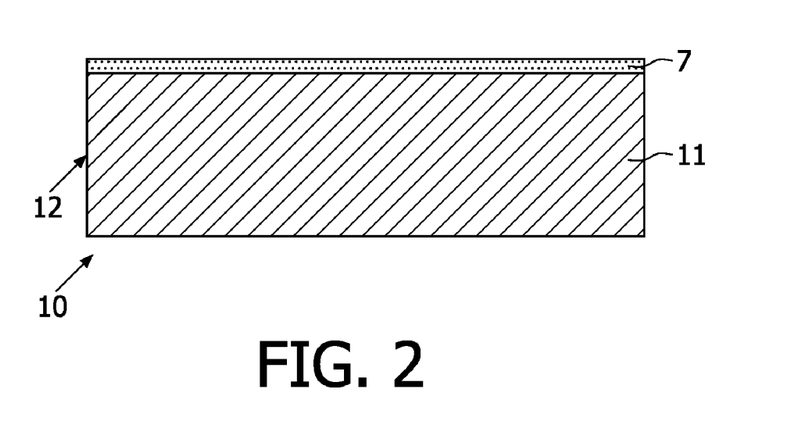
Figure 3:
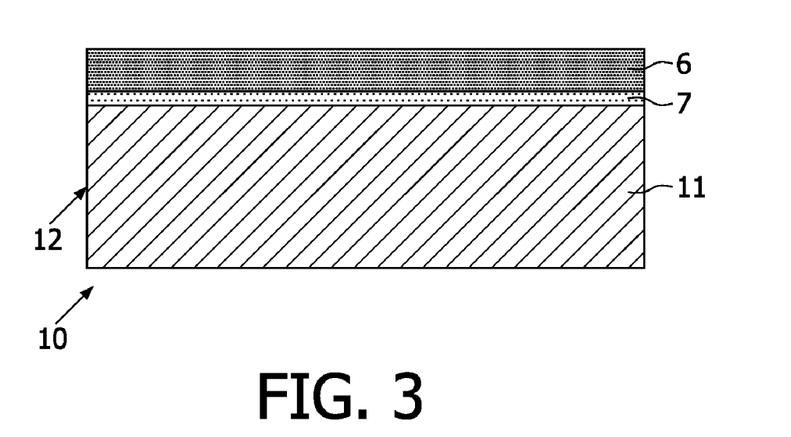
Figure 4:
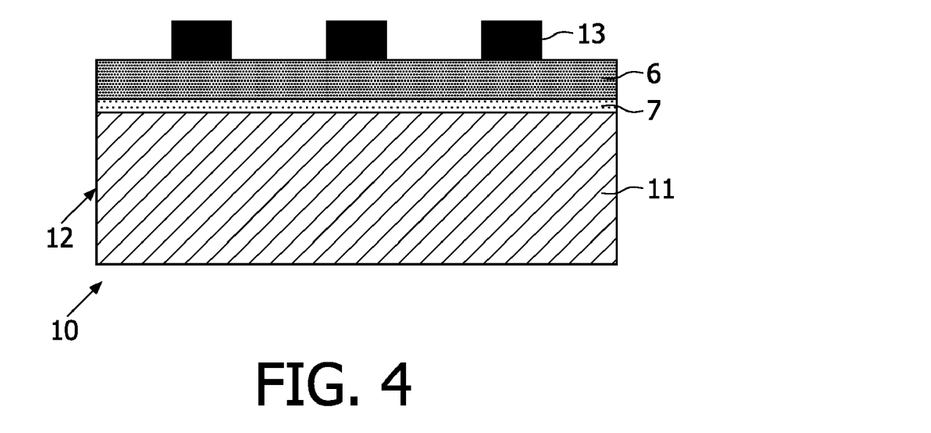
Figure 5:
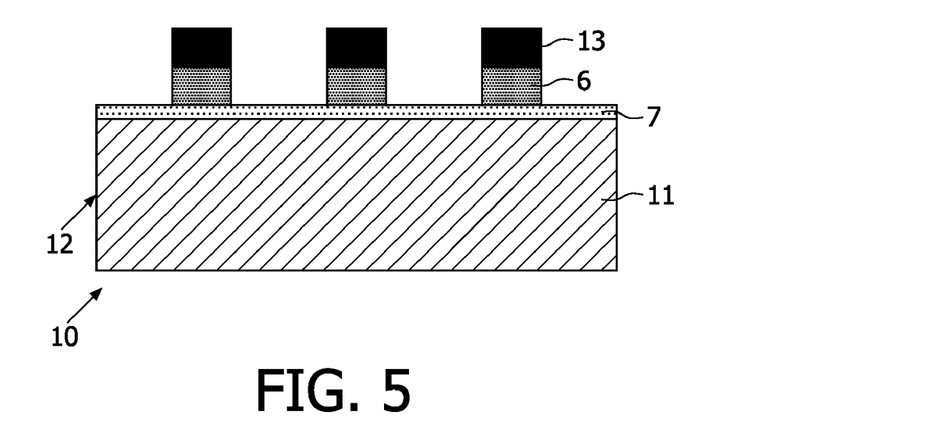
Figure 6:
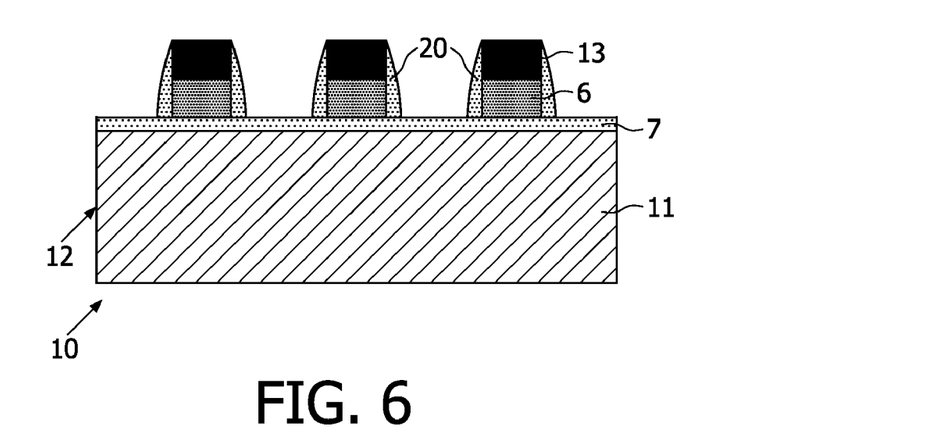
Figure 7:
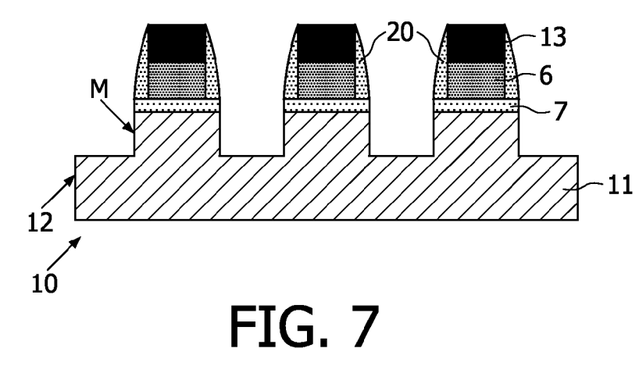
Figure 8:
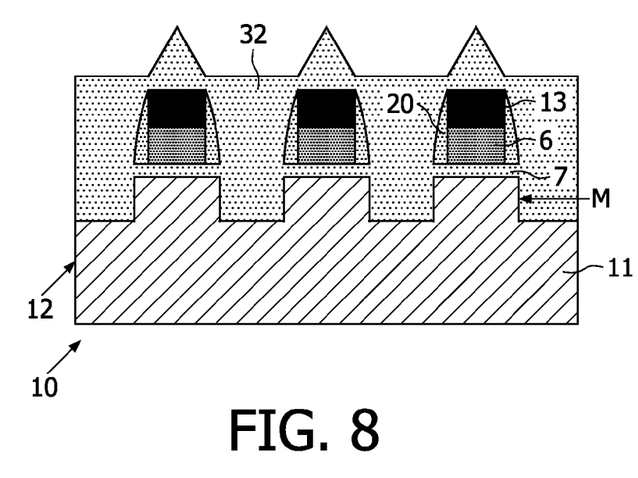
Figure 9:
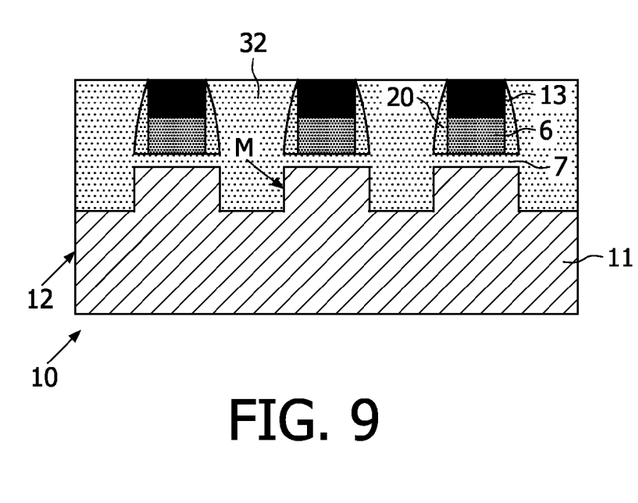
Figure 10:
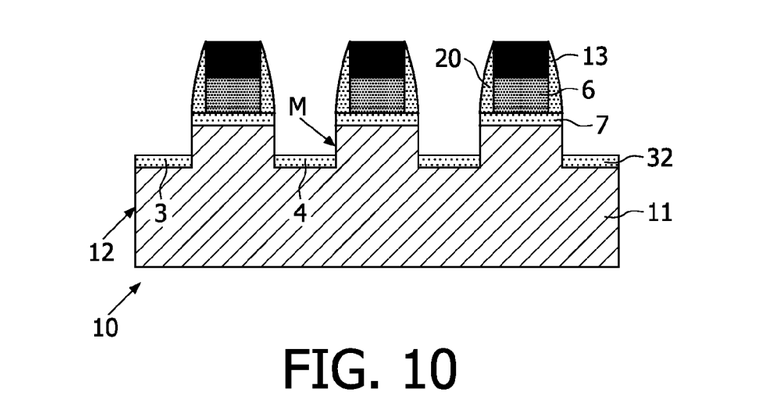
Figure 11:
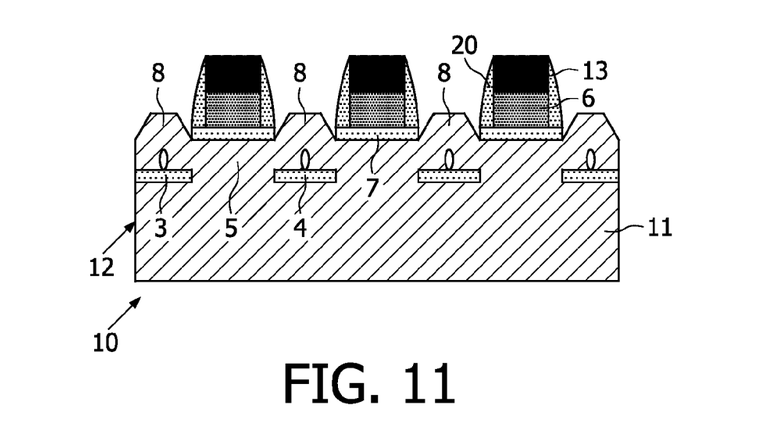
Figure 12:
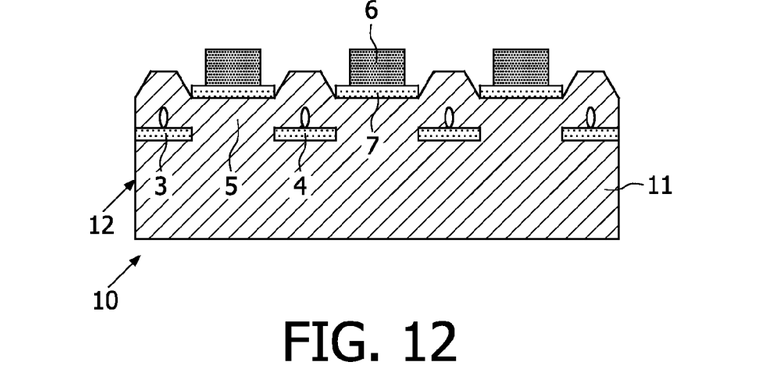
Figure 13:
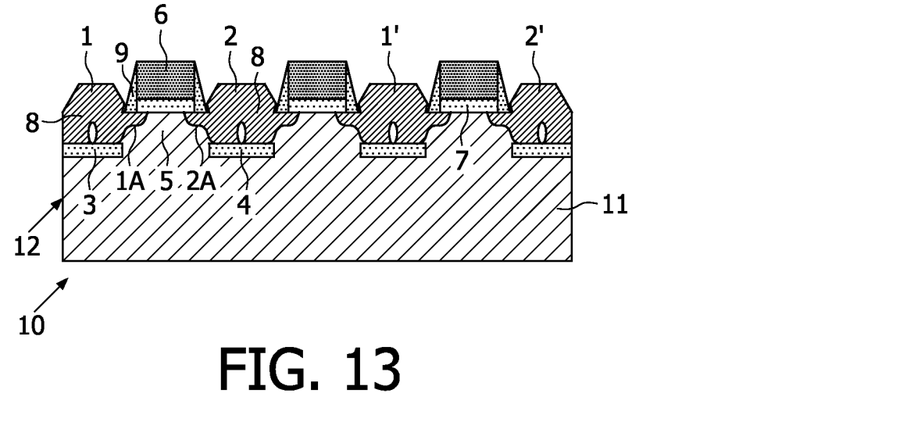
Figure 14:
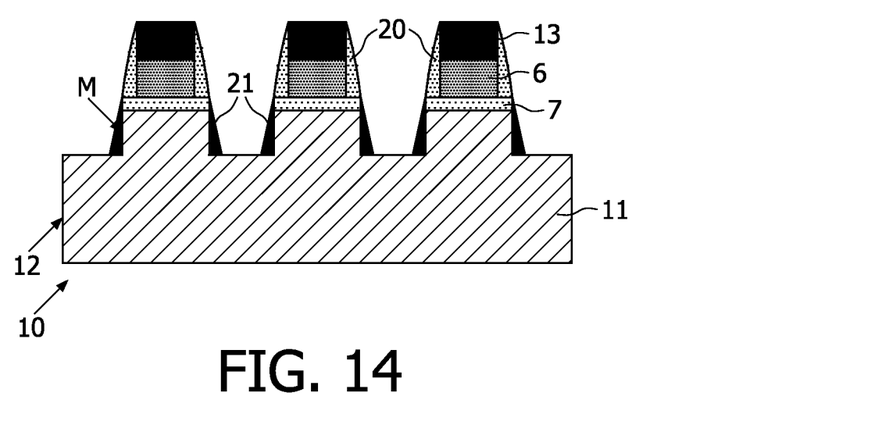
FIGS. 14 through 20 are sectional views of a semiconductor device with a field effect transistor at various stages in the manufacture of the device by means of a second embodiment of a method in accordance with the invention.
Figure 15:
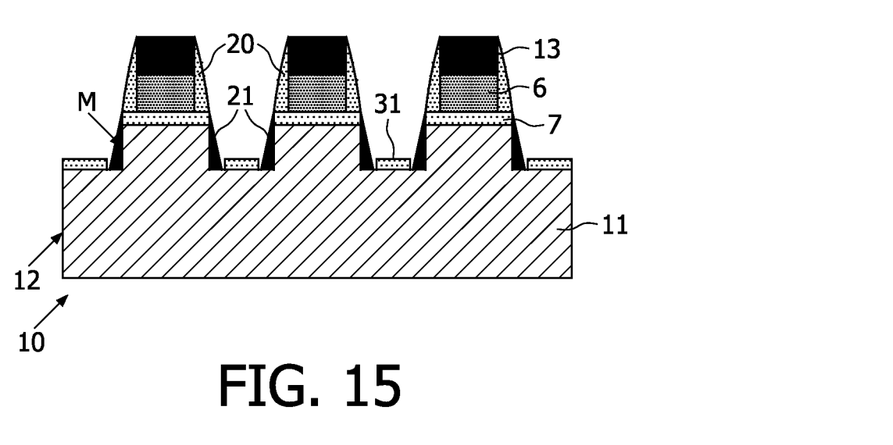
Figure 16:
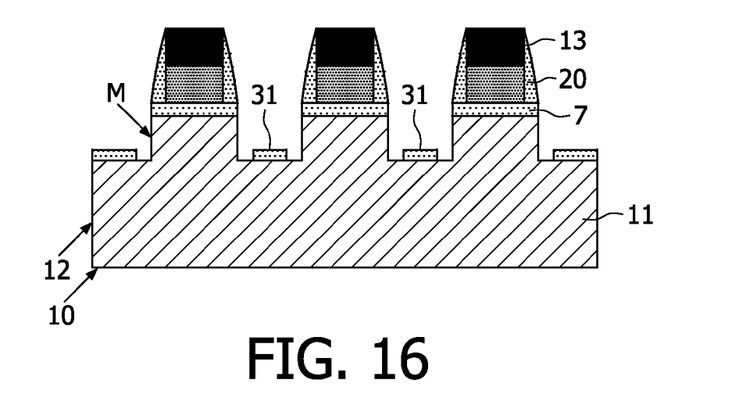
Figure 17:
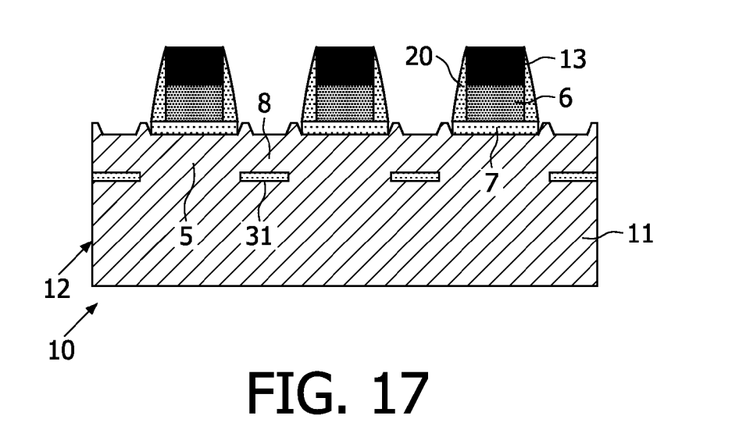
Figure 18:
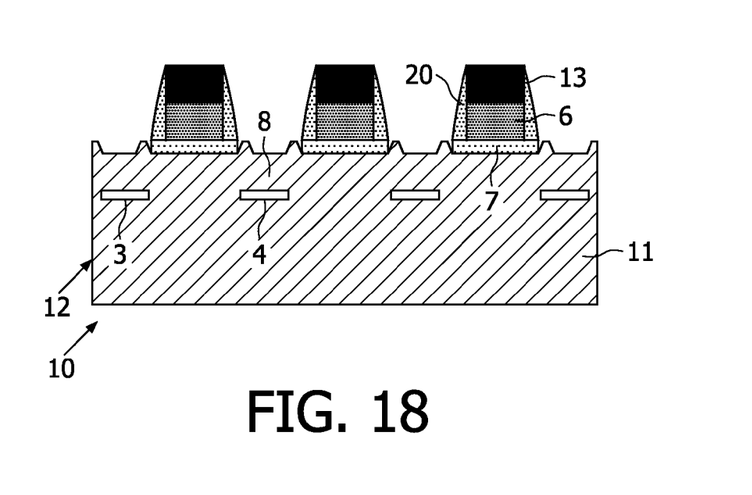
Figure 19:
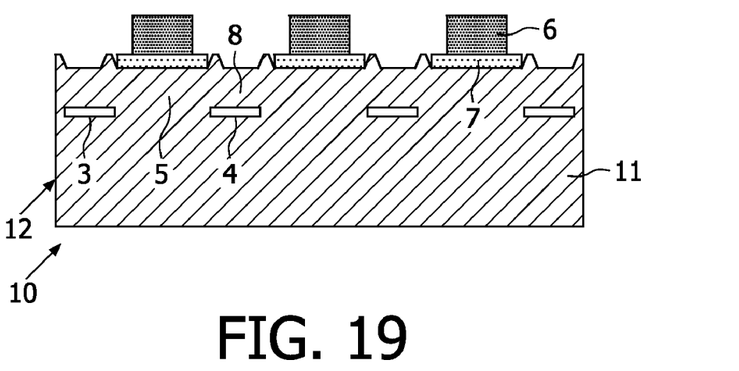
Figure 20:
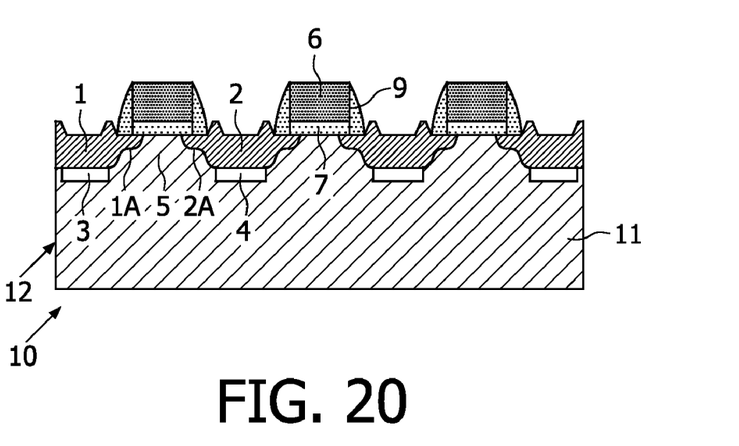
Figure 21:
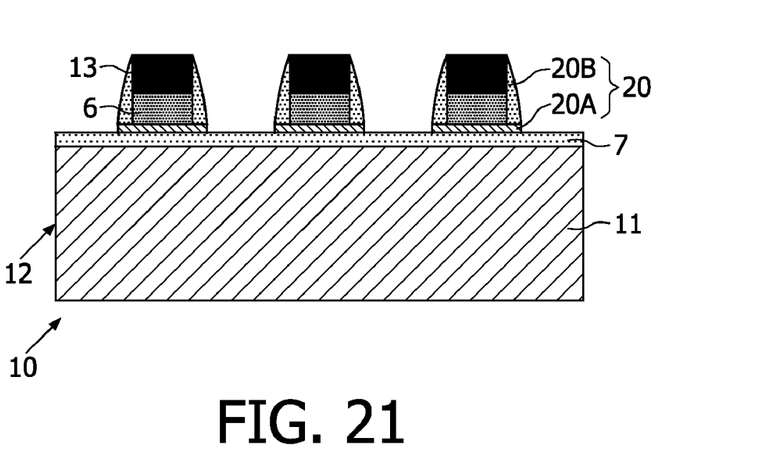
FIGS. 21 through 26 are sectional views of a semiconductor device with a field effect transistor at various stages in the manufacture of the device by means of a third embodiment of a method in accordance with the invention The Figures are diagrammatic and not drawn to scale, the dimensions in the thickness direction being particularly exaggerated for greater clarity. Corresponding parts are generally given the same reference numerals and the same hatching in the various Figures.
Figure 22:
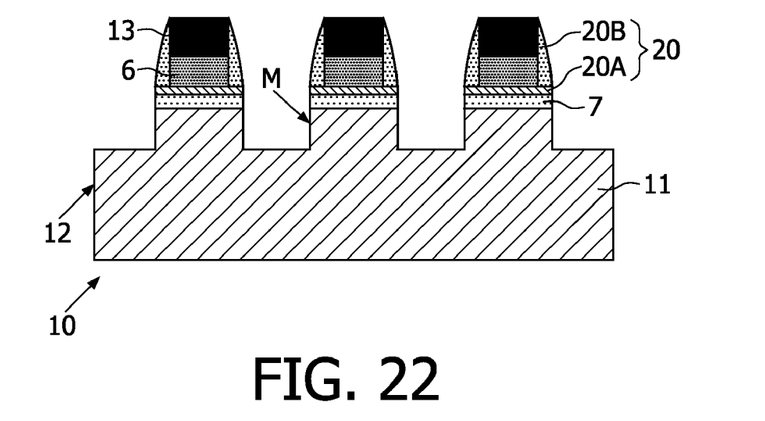
Figure 23:
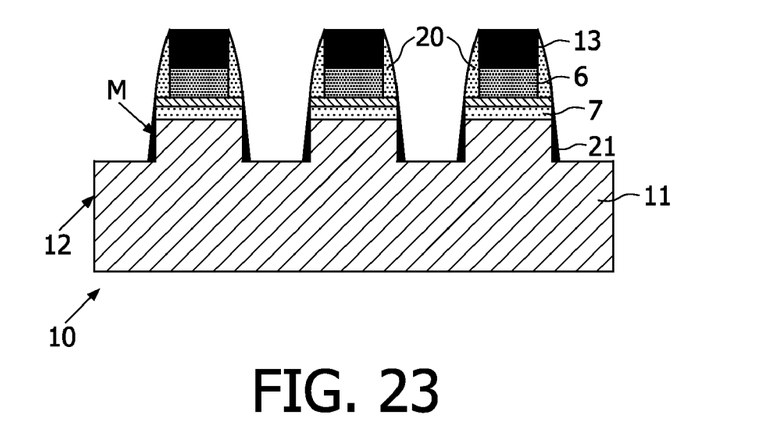
Figure 24:
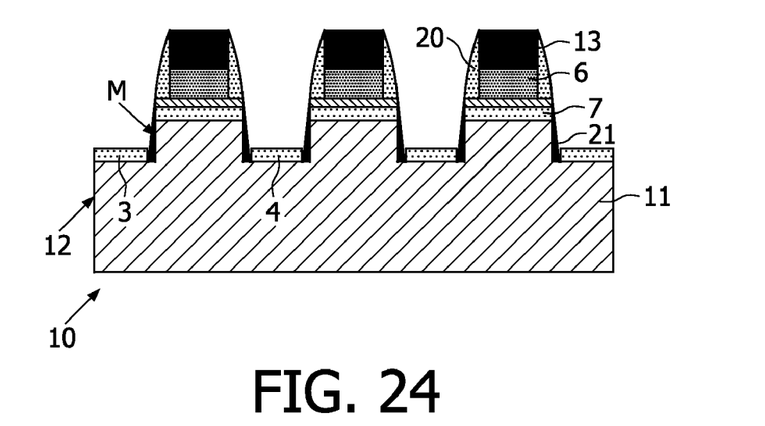
Figure 25:
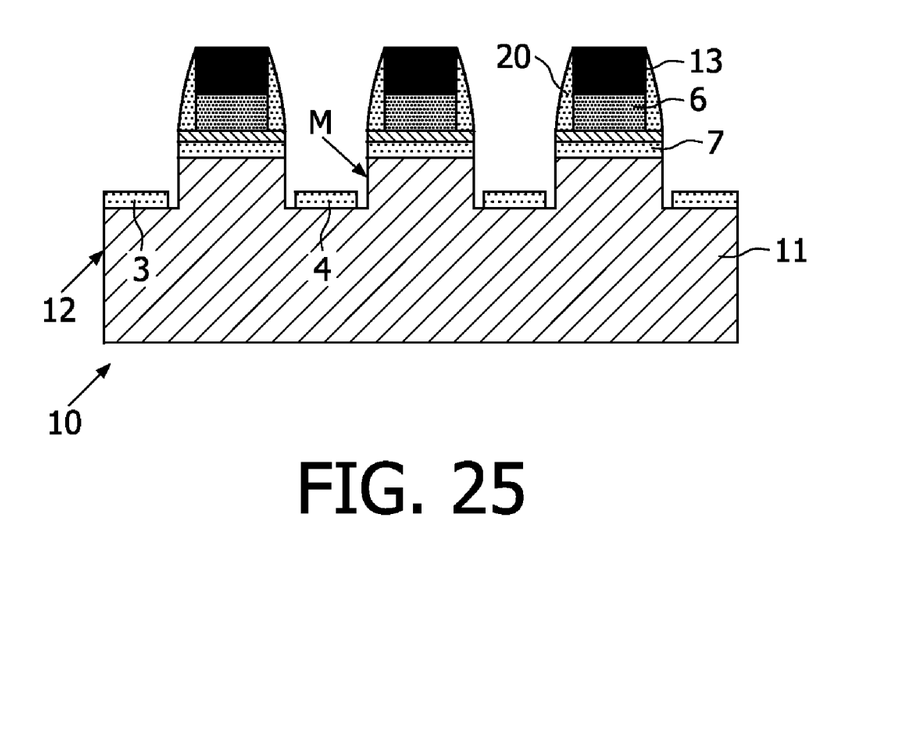
Figure 26:
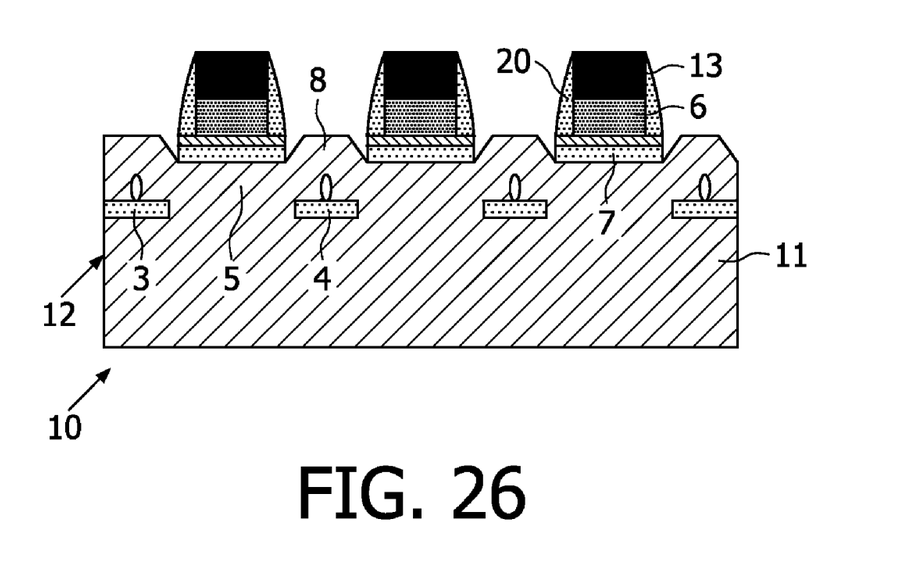

FIGS. 1 through 13 are sectional views of a semiconductor device with a field effect transistor at various stages in the manufacture of the device by means of a first embodiment of a method in accordance with the invention. The method for forming a device 10 starts (see FIG. 1) in this example with a substrate 11 which in this case, but not necessarily, comprises silicon and thus also forms part of the semiconductor body 12 of silicon and which in this example is of the p-type conductivity. It is to be noted here that the substrate 11 also can have the opposite conductivity type. Moreover, the region 11 may also be e.g. an n-well (or p-well for that matter) within a silicon substrate of the opposite conductivity type, e.g. p-type and n-type respectively. The device 10 to be formed, which is in this case an NMOST, contains near its borders isolation regions such as a so-called (shallow/deep) trench or LOCOS (=Local Oxidation of Silicon) isolation, which are formed in an early stage of the manufacture but are here not shown in the drawing nor discussed separately. In practice the device 10 may contain many transistors in e.g. a CMOS device 10 both of the NMOS and PMOS type.

At the surface of the semiconductor body 12 (see FIG. 2) a gate oxide layer 7 is formed e.g. by deposition but in this example by a thermal oxidation. The thickness of gate dielectric layer 7, here comprising silicon dioxide, is in this example 1.5 nm.

On the gate oxide layer 7 (see FIG. 3) a gate region forming layer 6 is deposited that comprises in this example a layer of polycrystalline silicon with a thickness of about 120 nm.

Subsequently (see FIG. 4) a hard mask layer 13, e.g. of a silicon oxy nitride and 75 nm thick, is deposited on the structure and patterned with photolithography and etching in order to form a finger structure for the gate region 6.

Next (see FIG. 5) the fingered gate region 6 is formed by etching, e.g. by dry/plasma etching.

Then (see FIG. 6) spacers 20 are formed, e.g. of silicon nitride and being formed by a conformal deposition followed by etching back/removing the horizontal parts of said deposition.

Hereinafter (see FIG. 7) a mesa M is formed below each finger of the gate region 6 by etching the semiconductor body 12, e.g. by a dry/plasma etching process. The height of the mesa's M, i.e. the part formed in the semiconductor body 12, is e.g. 100 nm.

Next (see FIG. 8) the open space between the mesa's M and the fingered gate regions 6 are filled with an insulating layer 32, in this example of silicon dioxide and formed by a deposition process like CVD (=Chemical Vapor Deposition).

Subsequently (see FIG. 9) the structure 10 is planarized using in this example a CMP (=Chemical Mechanical Polishing) technique.

Hereinafter (see FIG. 10) a part of the insulating layer 32 is removed by etching (back), in this example using a dry/plasma etch process. The resulting isolation regions 3,4 are e.g. about 25 nm thick and are positioned below the regions where the to be formed source and drain regions of the transistor will be positioned. Etching during a predetermined time can perform this step. If an etch stop layer, e.g. of a different insulating material, is incorporated into the insulating layer 32, the etching back can be less critical.

Then (see FIG. 11) a semiconductor region 8 is formed by means of epitaxial growth, here VPE (=Vapor Phase Epitaxy). The side faces of the mesa M, being exposed again by the partial removal of insulating layer 32, here function as the starting point for the epitaxial growth process, which in this example proceeds laterally. In this way the buried isolation regions 3,4 are buried by the semiconductor regions 8 which are formed after the growing silicon regions, starting from two bordering mesa's M, adjoin. The semiconductor regions 8 have transition regions adjoining the channel region 5, which is to be formed below the gate region 6, that have high crystalline quality. In this example the semiconductor region 8 is not intentionally or only moderately doped.

Subsequently (see FIG. 12) the temporarily spacers 20 and the hard mask layer 13 are removed, e.g. by a selective wet etching process step.

Hereinafter (see FIG. 13) source and drain regions 1,2 with extensions 1A, 2A are formed using two ion implantations of suitable doping ions. One implantation is performed in the presence of spacers 9 that border the gate region 6 and are formed as described above and comprise here silicon dioxide. In this way a deeper, highly doped part of the source and drain regions 1,2 is formed. The extensions 1A,2A are formed in the absence of spacers 9.

Finally the manufacturing of the MOSFET is further completed by deposition of a pre-metal dielectric, e.g. of silicondioxide, followed by patterning thereof, deposition of a contact metal layer, e.g. of aluminum, again followed by patterning by which contact regions are formed. These steps are not shown in the drawing. A (self-aligned) silicide process may further be used to contact the source- and drain regions 2,3 and the gate region 6. Individual devices 10 can be obtained by applying a separation technique like sawing.

FIGS. 14 through 20 are sectional views of a semiconductor device with a field effect transistor at various stages in the manufacture of the device by means of a second embodiment of a method in accordance with the invention. The method of this example starts in the same way as the method of the previous example and as illustrated in the FIGS. 1 to 7. Thus, we refer here to the discussion of that part of the first example.

In the first deviating step (see FIG. 14) additional temporarily spacers 21 are formed bordering the mesa's M. For these spacers 21 a different material is selected, e.g. silicon nitride in case the temporarily spacers 20 comprise silicon dioxide.

Next (see FIG. 15) a further semiconductor region 31 is formed by a local epitaxial growth process. The region 31 comprises a mixed crystal of silicon and germanium with a germanium content of about 20 at. % and a thickness of about 25 nm. In this example the region 31 also comprises a thin (e.g. 5 nm thick) protection/capping region of pure silicon on top of the SiGe region.

Subsequently (see FIG. 16) the temporarily spacers 21 are removed again by etching. In this example this may be done selectively using hot phosphoric acid since these spacers 21 comprise silicon nitride while spacers 20 and hard mask layer 13 comprise silicon dioxide.

Hereinafter (see FIG. 17) a semiconductor region 8 is formed by means of epitaxial growth. The side faces of the mesa M, being exposed again by the removal of spacers 21, here function as the starting point for the epitaxial growth process, in this example together with the upper surface of the semiconductor region 31.

Then (see FIG. 18) the semiconductor regions 31 are transformed into isolation regions 3,4 to be below the source/drain regions of the transistor to be formed. In this example this is done by selectively etching the SiGe of the semiconductor region 31. This can be done using a cavity formed in the surface of the semiconductor body which is used to form—at a later stage—deeper device 10 isolation. The SiGe regions 31 can be etched although said cavity/sunken isolation region—that is not shown in the drawing—do not need to be present between the individual source/drain fingers of the device 10 since the fingers positioned in intermediate positions can be reached from a direction perpendicular to the surface where the cavity/sunken isolation region that surrounds the device 10 is also present. The air present in isolation regions 3,4 may form an adequate isolation. If desired the empty regions 3,4 may be filled with an insulating material e.g. by CVD or by a thermal oxidation process.

Subsequently (see FIG. 19) the temporarily spacers 20 and the hard mask layer 13 are removed, e.g. by a selective wet etching process step.

Hereinafter (see FIG. 20) source and drain regions 1,2 with extensions 1A,2A are formed. The last stages in this example are identical to that of the first example.

FIGS. 21 through 26 are sectional views of a semiconductor device with a field effect transistor at various stages in the manufacture of the device by means of a third embodiment of a method in accordance with the invention. The method of this example starts in the same way as the method of the previous examples and as illustrated in the FIGS. 1 to 5. Thus, we refer here to the discussion of that part of the first example.

In the first deviating step (see FIG. 21) temporarily spacers 20 are formed bordering the fingered structure for the gate region 6 and the hard mask layer 13. For these spacers 20 a double spacer structure is chosen, comprising an L-shaped part 20A comprising silicon nitride and a bar-shaped part 20B comprising silicon dioxide. Spacers 20 of such a construction have the advantage that on the one hand they protect the gate region 6 against a thermal oxidation and on the other hand allow selective etching of silicon nitride elsewhere in a selective manner.

Next (see FIG. 22) mesa's M are formed in a similar manner as in the first two examples.

Hereinafter (see FIG. 23) the side faces of the mesa's M are protected by further temporarily spacers 21 that comprise in this example silicon nitride.

Subsequently (see FIG. 24) buried isolation regions 3,4 are formed by a local thermal oxidation.

Then (see FIG. 25) the temporarily spacers 21 are removed by selective etching using hot phosphoric acid.

Hereinafter (see FIG. 26) a further semiconductor region 31 comprising silicon is formed by a local epitaxial growth process. As in the first example this region is formed by lateral epitaxial growth starting from the side faces of the mesa's M.

The last stages of the manufacturing of this example are e.g. identical to those of the first two examples and are not discussed here separately. Reference is made for that reason to corresponding parts of the description of these examples.

It should be noted that the above-mentioned embodiments illustrate rather than limit the invention, and that those skilled in the art will be able to design many alternative embodiments without departing from the scope of the appended claims. For example in the embodiments the epitaxially grown semiconductor region in which the source/drain regions are formed was not intentionally or only moderately doped. However it is possible to incorporate a higher dope into this region if this is desired. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. Method of manufacturing a semiconductor device comprising a field effect transistor, in which method a semiconductor body of silicon with a substrate is provided at a surface thereof with a source region and a drain region of a first conductivity type which are situated above a buried isolation region and with a channel region, between the source and drain regions, of a second conductivity type, opposite to the first conductivity type, and with a gate region separated from the surface of the semiconductor body by a gate dielectric and situated above the channel region, and wherein a mesa is formed in the semiconductor body in which the channel region is formed and wherein the source and drain regions are formed on both side faces of the mesa with at least a predominate portion of the source and drain regions in a semiconductor region that is formed using epitaxial growth, the source and drain regions thereby contacting the channel and formed at least predominantly in material epitaxially grown, characterized in that the semiconductor region is formed contacting the mesa over substantially the whole thickness of the semiconductor region and is formed below the level of the gate dielectric.

2. Method according to claim 1, characterized in that the source and drain regions are provided with extensions and are formed in the semiconductor region using two ion implantations alongside the mesa while during one of these ion implantations spacers are present on the side faces of the mesa.

3. The method according to claim 2, wherein the ion implantation spacers are present for the first ion implantation of the source and drain regions, and the ion implantation spacers removed during second ion implantation, the second ion implantation including ion implantation of the source and drain regions as well as the extensions.

4. Method according to claim 1, characterized in that the source and drain regions are provided with extensions and are formed in the semiconductor region using two ion implantations alongside the mesa while during one of these ion implantations spacers are present on the side faces of the mesa, wherein the extensions are provided with an interdigited comb like structure.

5. Method according to claim 4, characterized in that the transistor is surrounded by a sunken isolation region extending into the semiconductor body to a greater depth than the buried isolation region.

6. Method according to claim 1, characterized in that the buried isolation region is formed before the forming of the semiconductor region by an over-all deposition of an insulating layer followed by removal of a part of the insulating layer.

7. Method according to claim 1, characterized in that at least parts of the side faces of the mesa are protected during processing by temporarily spacers.

8. Semiconductor device comprising a field effect transistor obtained by a method according to claim 1.

9. The method of claim 1, wherein the source and drain regions are provided with extensions formed by ion implantation of a portion of the mesa extending from the side face of the mesa toward the center of the mesa, leaving the channel region between the extensions.

10. The method of claim 1, wherein the source and drain regions are provided with ion implantation resulting in a higher doping concentration than the doping concentration of extensions of the source and drain regions.

11. Method of manufacturing a semiconductor device comprising a field effect transistor, in which method a semiconductor body of silicon with a substrate is provided at a surface thereof with a source region and a drain region of a first conductivity type which are situated above a buried isolation region and with a channel region, between the source and drain regions, of a second conductivity type, opposite to the first conductivity type, and with a gate region separated from the surface of the semiconductor body by a gate dielectric and situated above the channel region, and wherein a mesa is formed in the semiconductor body in which the channel region is formed and wherein the source and drain regions are formed on both side faces of the mesa with at least a predominate portion of the source and drain regions in a semiconductor region that is formed using epitaxial growth, the source and drain regions thereby contacting the channel and formed at least predominantly in material epitaxially grown, characterized in that the semiconductor region is formed contacting the mesa over substantially the whole thickness of the semiconductor region and is formed below the level of the gate dielectric, wherein the buried isolation region is formed by formation of a further semiconductor region including a mixed crystal of silicon and germanium which after formation of the semiconductor region is removed by selective etching.

* * * * *